(12) United States Patent
Wasilik et al.

(10) Patent No.: US 10,367,470 B2
(45) Date of Patent: Jul. 30, 2019

(54) WAFER-LEVEL-PACKAGED BAW DEVICES WITH SURFACE MOUNT CONNECTION STRUCTURES

(71) Applicant: Qorvo US, Inc., Greensboro, NC (US)

(72) Inventors: Matthew L. Wasilik, Plano, TX (US); Buu Quoc Diep, Murphy, TX (US); Ian Y. Yee, Austin, TX (US); Bang Nguyen, Richardson, TX (US); Ebrahim Andideh, Portland, OR (US); Robert Kraft, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 52 days.

(21) Appl. No.: 15/727,117

(22) Filed: Oct. 6, 2017

(65) Prior Publication Data

US 2018/0109237 A1    Apr. 19, 2018

Related U.S. Application Data

(60) Provisional application No. 62/409,914, filed on Oct. 19, 2016.

(51) Int. Cl.
*H03H 9/10* (2006.01)
*H03H 9/17* (2006.01)
(Continued)

(52) U.S. Cl.
CPC ........... *H03H 9/105* (2013.01); *H01L 41/083* (2013.01); *H01L 41/29* (2013.01); *H03H 9/0014* (2013.01);
(Continued)

(58) Field of Classification Search
CPC ................ H03H 9/02–9/12; H03H 9/54–9/62
See application file for complete search history.

(56) References Cited

U.S. PATENT DOCUMENTS 3,731,230 A    5/1973  Cerny, Jr.
3,875,533 A    4/1975  Irwin et al.
(Continued)

FOREIGN PATENT DOCUMENTS

JP    2012257050 A    12/2012

OTHER PUBLICATIONS

Final Office Action for U.S. Appl. No. 14/757,651, dated Sep. 19, 2018, 7 pages.
(Continued)

*Primary Examiner* — Dean O Takaoka
*Assistant Examiner* — Alan Wong
(74) *Attorney, Agent, or Firm* — Withrow & Terranova, P.L.L.C.

(57) ABSTRACT

The present disclosure relates to a Wafer-Level-Packaged (WLP) Bulk Acoustic Wave (BAW) device that includes a BAW resonator, a WLP enclosure, and a surface mount connection structure. The BAW resonator includes a piezoelectric layer with an opening and a bottom electrode lead underneath the piezoelectric layer, such that a portion of the bottom electrode lead is exposed through the opening of the piezoelectric layer. The WLP enclosure includes a cap and an outer wall that extends from the cap toward the piezoelectric layer to form a cavity. The opening of the piezoelectric layer is outside the cavity. The surface mount connection structure covers a portion of a top surface of the cap and extends continuously over a side portion of the WLP enclosure and to the exposed portion of the bottom electrode lead through the opening of the piezoelectric layer.

35 Claims, 12 Drawing Sheets

Figure 1:
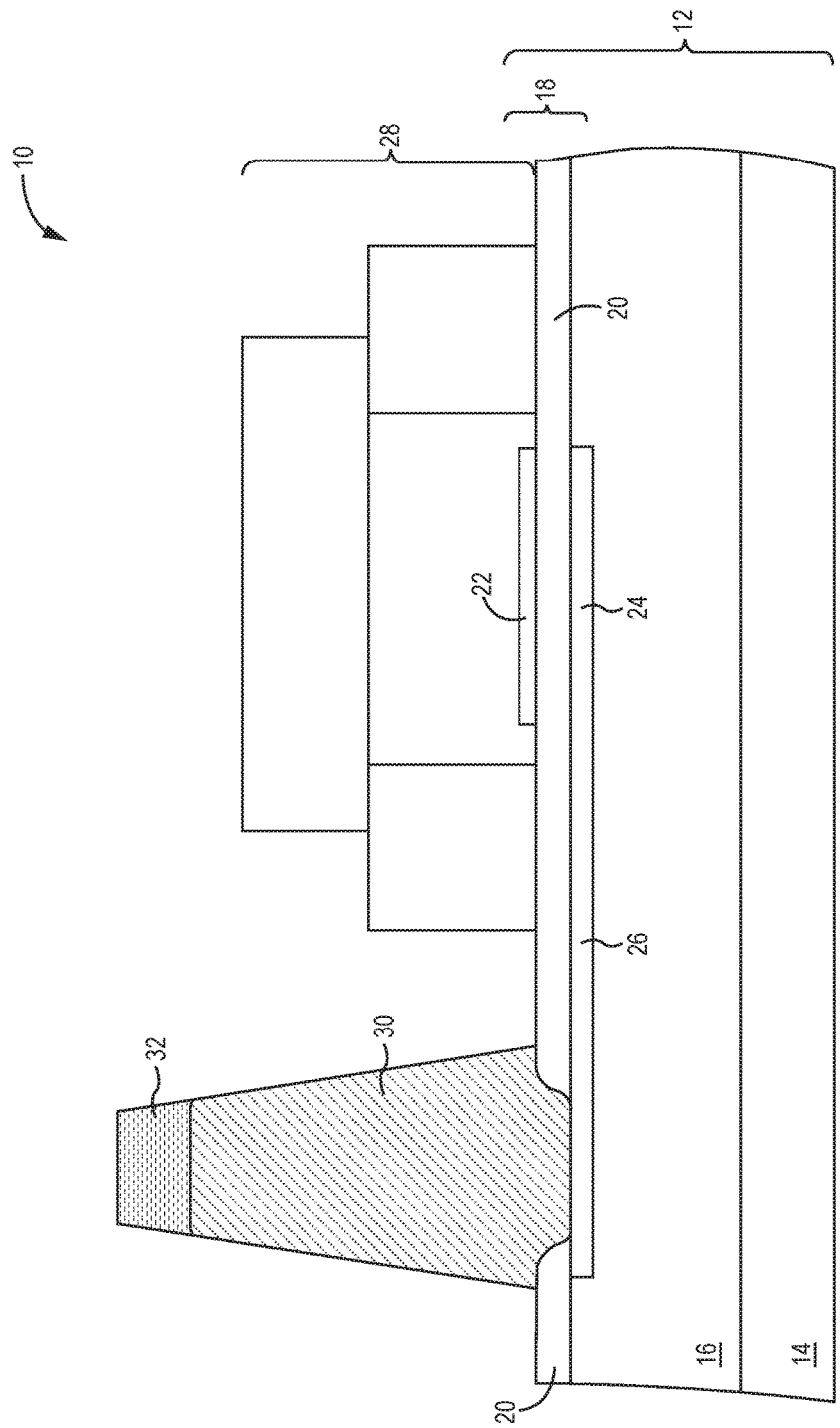

(51) Int. Cl.
  *H01L 41/29* (2013.01)
  *H03H 9/02* (2006.01)
  *H03H 9/05* (2006.01)
  *H01L 41/083* (2006.01)
  *H03H 9/00* (2006.01)

(52) U.S. Cl.
  CPC ...... *H03H 9/02015* (2013.01); *H03H 9/0514* (2013.01); *H03H 9/1014* (2013.01); *H03H 9/171* (2013.01); *H03H 9/173* (2013.01)

(56) References Cited

U.S. PATENT DOCUMENTS

| | | | |
|---|---|---|---|
| 4,577,168 | A | 3/1986 | Hartmann |
| 5,291,159 | A | 3/1994 | Vale |
| 6,067,391 | A | 5/2000 | Land |
| 6,714,099 | B2 | 3/2004 | Hikita et al. |
| 6,720,844 | B1 | 4/2004 | Lakin |
| 6,927,649 | B2 | 8/2005 | Metzger et al. |
| 7,057,478 | B2 | 6/2006 | Korden et al. |
| 7,173,504 | B2 | 2/2007 | Larson, III et al. |
| 7,239,067 | B2 * | 7/2007 | Komuro ............... H03H 3/02 216/13 |
| 7,321,183 | B2 | 1/2008 | Ebuchi et al. |
| 7,342,351 | B2 | 3/2008 | Kubo et al. |
| 7,391,285 | B2 | 6/2008 | Larson, III et al. |
| 7,436,269 | B2 | 10/2008 | Wang et al. |
| 7,804,374 | B1 | 9/2010 | Brown et al. |
| 7,825,749 | B2 | 11/2010 | Thalhammer et al. |
| 7,898,493 | B1 | 3/2011 | Rojas et al. |
| 7,956,705 | B2 | 6/2011 | Meister et al. |
| 7,973,620 | B2 | 7/2011 | Shirakawa et al. |
| 8,248,185 | B2 | 8/2012 | Choy et al. |
| 8,508,315 | B2 | 8/2013 | Jamneala et al. |
| 8,576,024 | B2 | 11/2013 | Erb et al. |
| 8,923,794 | B2 | 12/2014 | Aigner |
| 8,991,022 | B2 * | 3/2015 | Satoh ............... H03H 9/1035 29/25.35 |
| 9,054,671 | B2 * | 6/2015 | Adkisson ............... H03H 9/173 |
| 9,054,674 | B2 | 6/2015 | Inoue et al. |
| 9,484,883 | B2 | 11/2016 | Nishizawa et al. |
| 9,698,756 | B2 | 7/2017 | Khlat et al. |
| 9,887,686 | B2 | 2/2018 | Kuwahara |
| 9,929,716 | B2 * | 3/2018 | Lee ............... H03H 3/02 |
| 10,009,001 | B2 * | 6/2018 | Jiang ............... H01L 21/32136 |
| 2002/0109564 | A1 | 8/2002 | Tsai et al. |
| 2005/0093648 | A1 | 5/2005 | Inoue |
| 2005/0206476 | A1 | 9/2005 | Ella et al. |
| 2006/0091978 | A1 | 5/2006 | Wang et al. |
| 2008/0007369 | A1 | 1/2008 | Barber et al. |
| 2009/0096549 | A1 | 4/2009 | Thalhammer et al. |
| 2009/0096550 | A1 | 4/2009 | Handtmann et al. |
| 2010/0277237 | A1 | 11/2010 | Sinha et al. |
| 2011/0210787 | A1 | 9/2011 | Lee et al. |
| 2012/0007696 | A1 | 1/2012 | Pang et al. |
| 2012/0313725 | A1 | 12/2012 | Ueda et al. |
| 2013/0113576 | A1 | 5/2013 | Inoue et al. |
| 2015/0222246 | A1 | 8/2015 | Nosaka |
| 2015/0369153 | A1 | 12/2015 | Tsunooka et al. |
| 2016/0028364 | A1 | 1/2016 | Takeuchi |
| 2016/0191012 | A1 | 6/2016 | Khlat et al. |
| 2016/0191014 | A1 | 6/2016 | Khlat et al. |
| 2016/0191016 | A1 | 6/2016 | Khlat et al. |
| 2016/0261235 | A1 | 9/2016 | Ortiz |
| 2016/0268998 | A1 | 9/2016 | Xu et al. |
| 2017/0093369 | A1 | 3/2017 | Khlat et al. |
| 2017/0093370 | A1 | 3/2017 | Khlat et al. |
| 2017/0201233 | A1 | 7/2017 | Khlat |
| 2017/0301992 | A1 | 10/2017 | Khlat et al. |
| 2017/0324159 | A1 | 11/2017 | Khlat |
| 2018/0013402 | A1 | 1/2018 | Kirkpatrick et al. |
| 2018/0076793 | A1 | 3/2018 | Khlat et al. |
| 2018/0076794 | A1 | 3/2018 | Khlat et al. |
| 2018/0219530 | A1 | 8/2018 | Khlat et al. |

OTHER PUBLICATIONS

Non-Final Office Action for U.S. Appl. No. 15/701,759, dated Oct. 4, 2018, 10 pages.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Final Office Action for U.S. Appl. No. 15/275,957, dated Jan. 2, 2018, 7 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.

(56) References Cited

OTHER PUBLICATIONS

Non-Final Office Action for U.S. Appl. No. 15/697,658, dated May 1, 2019, 13 pages.

* cited by examiner

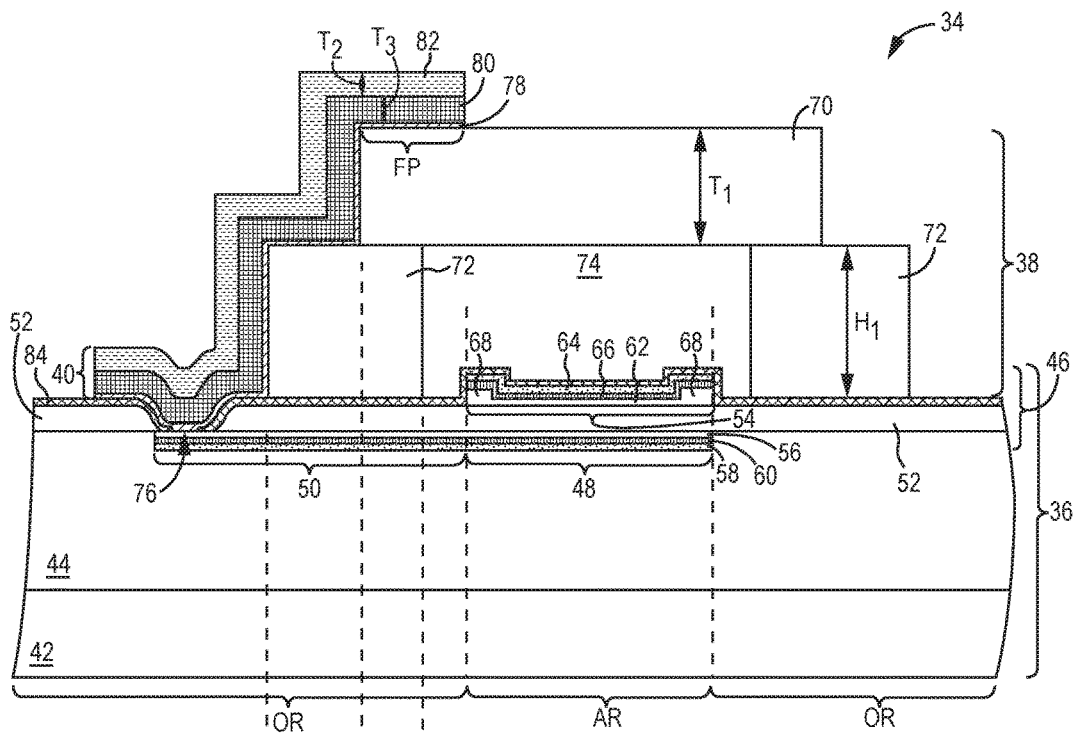
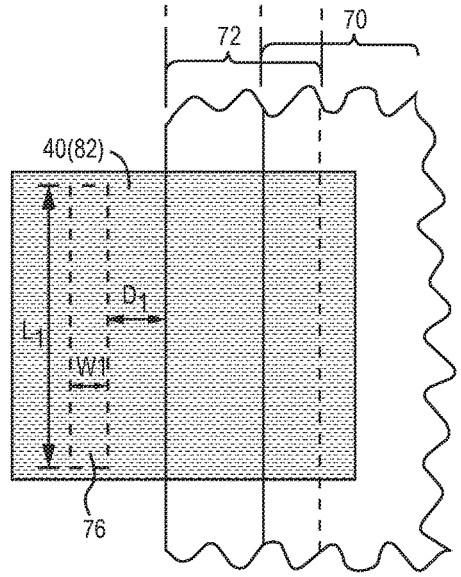
FIG. 2A
FIG. 2B

WAFER-LEVEL-PACKAGED BAW DEVICES WITH SURFACE MOUNT CONNECTION STRUCTURES

RELATED APPLICATIONS

This application claims the benefit of provisional patent application Ser. No. 62/409,914, filed Oct. 19, 2016, the disclosure of which is hereby incorporated herein by reference in its entirety.

FIELD OF THE DISCLOSURE

The present disclosure relates to a Wafer-Level-Packaged (WLP) Bulk Acoustic Wave (BAW) device, and more particularly to a WLP BAW device with surface mount connection structures.

BACKGROUND

Due to their small size, high Q values, and very low insertion losses at microwave frequencies, particularly those above 1.5 Gigahertz (GHz), Bulk Acoustic Wave (BAW) devices have been widely used in modern wireless applications. For instance, BAW filters are the filter of choice for many $3^{rd}$ Generation (3G) and $4^{th}$ Generation (4G) wireless devices, and are destined to dominate filter applications for 5th Generation (5G) wireless devices. The low insertion loss of the BAW filter provides many advantages such as improved battery life, compensation for higher losses associated with the need to support many frequency bands in a single mobile device, etc.

One example of a conventional Wafer-Level-Packaged (WLP) BAW device 10 is illustrated in FIG. 1. The BAW device 10 includes a BAW resonator 12 that has a substrate 14, a reflector 16 over the substrate 14, and a transducer 18 over the reflector 16. The reflector 16 is typically formed by a stack of reflector layers (not shown), which alternate in material composition to produce a significant reflection coefficient at the junction of adjacent reflector layers. The transducer 18 includes a piezoelectric layer 20, which is sandwiched between a top electrode 22 and a bottom electrode 24. The transducer 18 may also include a bottom electrode lead 26, which resides underneath the piezoelectric layer 20 and is connected to the bottom electrode 24.

In order to protect BAW resonators from external elements (such as moisture, contamination, etc.), housings, also known as WLP walls and caps, are applied to enclose the BAW resonators. In this example, the BAW device 10 includes a WLP enclosure 28, which is coupled to the piezoelectric layer 20 to encapsulate the top electrode 22 of the BAW resonator 12. In addition, the piezoelectric layer 20 has an opening outside the WLP enclosure 28, where a portion of the bottom electrode lead 26 is exposed through the opening of the piezoelectric layer 20. A copper pillar connection 30 with a tin cap 32 is coupled to the exposed portion of the bottom electrode lead 26 to provide an external electrical connection for the BAW device 10.

Because of the processing constraints, there are space requirements between the WLP enclosure 28 and the copper pillar connection 30. In addition, the round shape of the copper pillar connection 30 will also take up a significant area of device space. As such, the opening of the piezoelectric layer 20 needs to be relatively far away from the WLP enclosure 28 to accommodate the copper pillar connection 30. Accordingly, there remains a need for improved BAW device designs to reduce the device size without affecting the external electrical connection of the BAW device. Further, there is also a need to keep the final product cost effective.

SUMMARY

The present disclosure relates to a Wafer-Level-Packaged (WLP) Bulk Acoustic Wave (BAW) device that includes a piezoelectric layer with an opening, a bottom electrode, a bottom electrode lead extending from the bottom electrode, a top electrode, a WLP enclosure, and a surface mount connection structure. The bottom electrode and the bottom electrode lead are over a bottom surface of the piezoelectric layer and a portion of the bottom electrode lead is exposed through the opening of the piezoelectric layer. The top electrode is over a top surface of the piezoelectric layer, which is opposite the bottom surface of the piezoelectric layer. An active region for a resonator is formed where the bottom electrode and the top electrode overlap. The WLP enclosure includes a cap and an outer wall that extends from the cap toward the top surface of the piezoelectric layer to form a cavity. Herein, the top electrode resides in the cavity and the opening of the piezoelectric layer is outside the cavity. The surface mount connection structure covers a first portion of a top surface of the cap and extends continuously over a side portion of the WLP enclosure and to the exposed portion of the bottom electrode lead through the opening of the piezoelectric layer.

In one embodiment of the WLP BAW device, the opening of the piezoelectric layer is adjacent to the outer wall with a distance less than 10 µm.

In one embodiment of the WLP BAW device, the opening of the piezoelectric layer has a width between 2 µm and 20 µm, and a length between 5 µm and 250 µm.

In one embodiment of the WLP BAW device, the surface mount connection structure includes a first connection layer formed of Copper (Cu) or Gold (Au), and a second connection layer over the first connection layer and formed of Tin (Sn) or Tin-lead (Sn—Pb).

In one embodiment of the WLP BAW device, the first connection layer has a thickness between 3 µm and 60 µm, and the second connection layer has a thickness between 10 µm and 40 µm.

In one embodiment of the WLP BAW device, the surface mount connection structure further includes a connection seed layer underneath the first connection layer and formed of Titanium (Ti) or Titanium Tungsten (TiW).

In one embodiment of the WLP BAW device, the cap has a thickness between 10 µm and 60 µm, and the outer wall has a height between 10 µm and 60 µm.

According to another embodiment, the WLP BAW device further includes a surface mount connection extension, which is connected to the surface mount connection structure and extends over a second portion of the top surface of the cap.

In one embodiment of the WLP BAW device, the second portion of the top surface of the cap covers between 10% and 95% of the cavity.

In one embodiment of the WLP BAW device, the surface mount connection structure and the surface mount connection extension are formed from a common first connection layer. The surface mount connection structure further includes a second connection layer over the first connection layer. The first connection layer is formed of Cu or Au, and the second connection layer is formed of Sn or Sn—Pb.

In one embodiment of the WLP BAW device, the surface mount connection extension further includes the second connection layer.

In one embodiment of the WLP BAW device, the surface mount connection extension does not include the second connection layer.

In one embodiment of the WLP BAW device, the outer wall includes a recess at an outer side surface of the outer wall. Herein, the opening of the piezoelectric layer is confined within the recess, such that the surface mount connection structure covers the first portion of the top surface of the cap, and extends continuously over the side portion of the WLP enclosure through the recess and to the exposed portion of the bottom electrode lead through the opening of the piezoelectric layer.

According to another embodiment, the WLP BAW device is included in a system assembly. Besides the WLP BAW device, the system assembly also includes a printed circuit board (PCB) having a PCB lead and a PCB laminate body. Herein, the PCB laminate body is parallel with the cap. The PCB lead is embedded in the PCB laminate body, extends over a portion of a first surface of the PCB laminate body, and is coupled to the surface mount connection structure.

In one embodiment of the system assembly, the surface mount connection structure includes a surface mount lead and a surface mount pad. The surface mount pad is over the top surface of the cap and in contact with the PCB lead. The surface mount lead is connected to the exposed portion of the bottom electrode lead, and extends continuously from the opening of the piezoelectric layer, over the side portion of the WLP enclosure, and to the surface mount pad.

In one embodiment of the system assembly, the surface mount pad has a width between 10 μm and 50 μm, and the surface mount lead has a width between 10 μm and 250 μm.

In one embodiment of the system assembly, a width of the surface mount pad is no wider than a width of the surface mount lead.

According to another embodiment, the system assembly further includes a mold compound material that encapsulates the WLP BAW device and the PCB, and fills gaps in between.

According to another embodiment, the system assembly further includes a surface mount connection extension, which is connected to the surface mount connection structure and extends over a second portion of the top surface of the cap.

In another embodiment, a WLP BAW device includes a first BAW resonator, a second BAW resonator, a WLP enclosure, a first surface mount connection structure, and a second surface mount connection structure. Herein, the first BAW resonator and the second BAW resonator share a common piezoelectric layer, which includes a first opening and a second opening. The first BAW resonator includes a first bottom electrode lead underneath the piezoelectric layer, wherein a portion of the first bottom electrode lead is exposed through the first opening of the piezoelectric layer. The second BAW resonator includes a second bottom electrode lead underneath the piezoelectric layer, wherein a portion of the second bottom electrode lead is exposed through the second opening of the piezoelectric layer. The WLP enclosure includes a cap and an outer wall that extends from the cap toward the top surface of the piezoelectric layer to form a cavity. The first BAW resonator and the second BAW resonator reside in the cavity. The first opening and the second opening of the piezoelectric layer are outside the cavity. The first surface mount connection structure is connected to the exposed portion of the first bottom electrode lead, and extends continuously from the first opening of the piezoelectric layer, along a first side portion of the WLP enclosure, and to a top surface of the cap. The second surface mount connection structure is connected to the exposed portion of the second bottom electrode lead, and extends continuously from the second opening of the piezoelectric layer, along a second side portion of the WLP enclosure, and to the top surface of the cap.

In one embodiment of the WLP BAW device, the WLP enclosure further includes a continuous inner wall, which extends from the cap toward the top surface of the piezoelectric layer and is connected to the outer wall. The continuous inner wall divides the cavity into a first sub-cavity and a second sub-cavity, such that the first BAW resonator resides in the first sub-cavity and the second BAW resonator resides in the second sub-cavity.

In one embodiment of the WLP BAW device, the WLP enclosure further includes a stand-alone inner wall, which extends from the cap toward the top surface of the piezoelectric layer and is not connected to the outer wall.

According to another embodiment, the WLP BAW device further includes a surface mount connection extension, which is connected to the first surface mount connection structure and extends over a portion of the top surface of the cap.

In one embodiment of the WLP BAW device, the surface mount connection extension provides an integrated inductor.

In one embodiment of the WLP BAW device, the surface mount connection extension is a slab.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a conventional Wafer-Level-Packaged (WLP) Bulk Acoustic Wave (BAW) device.

FIGS. 2A-2B provide an exemplary WLP BAW device with a surface mount connection structure.

Figure 3A:
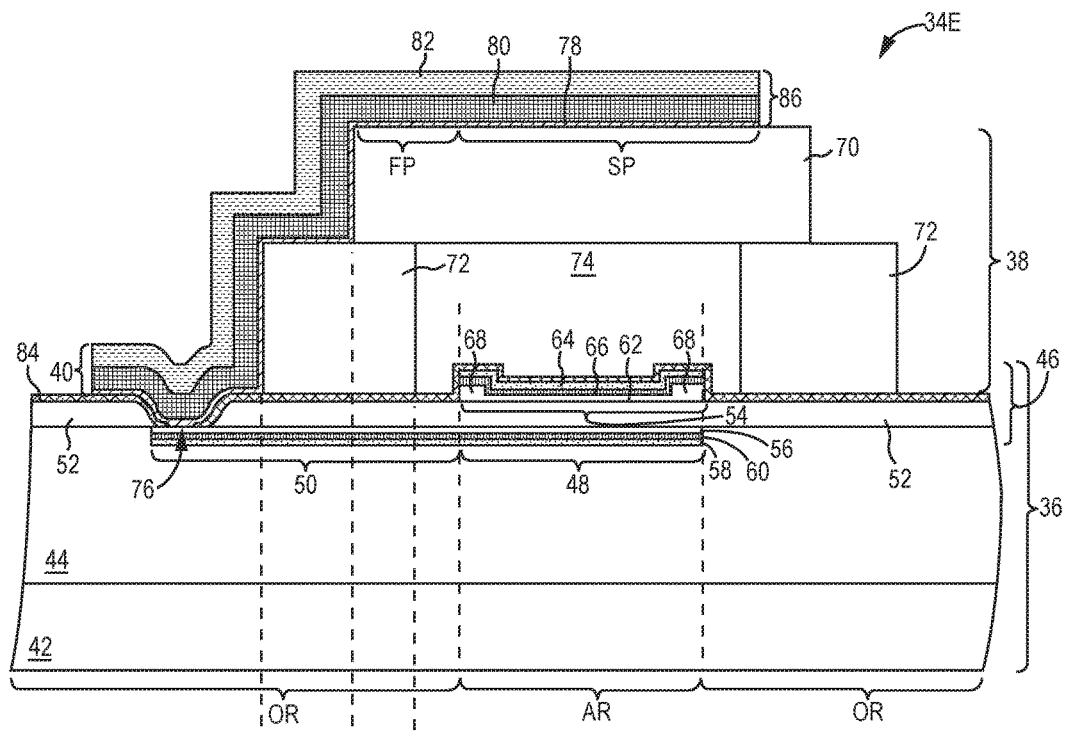
Figure 3B:
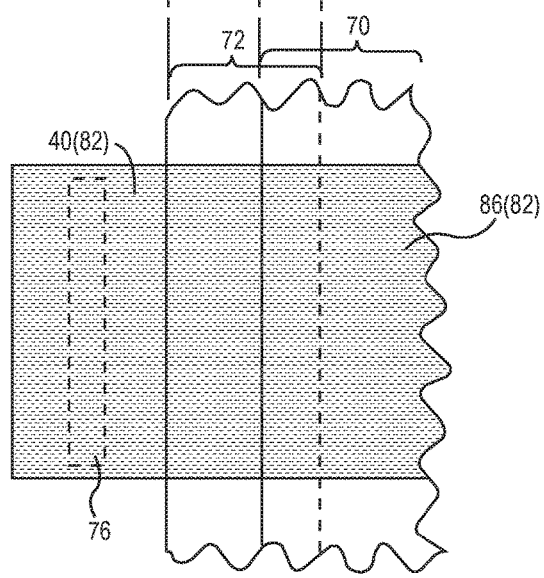

FIGS. 3A-3B provide an exemplary WLP BAW device with a surface mount connection extension.

Figure 4A:
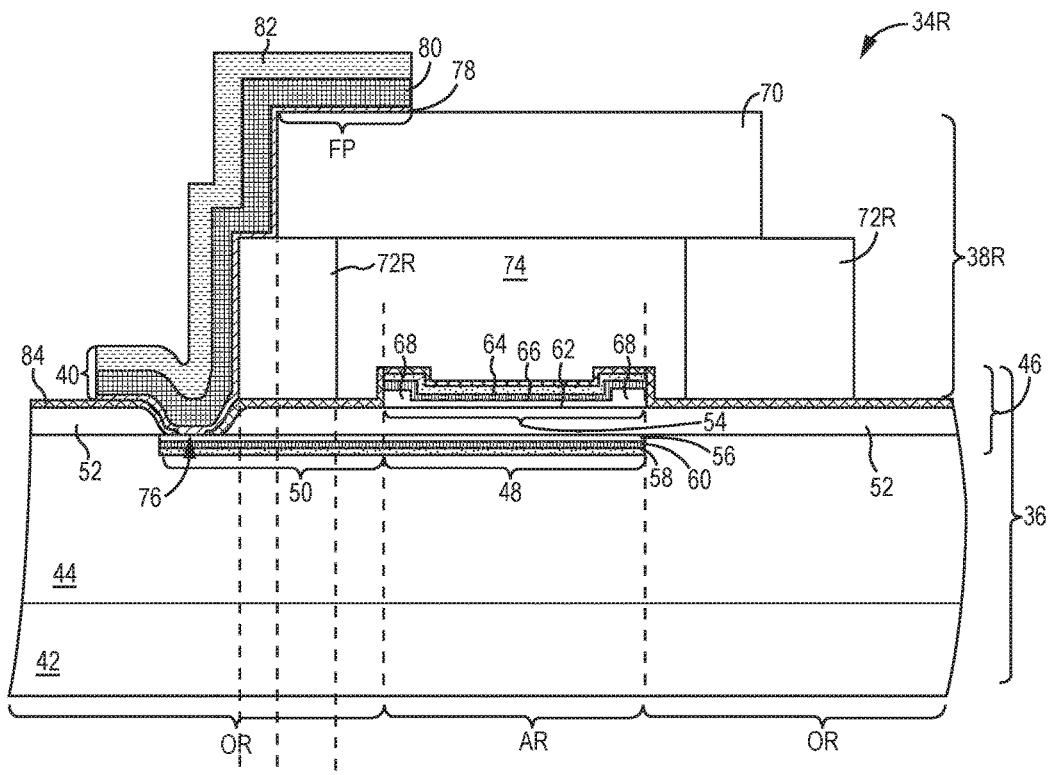
Figure 4B:
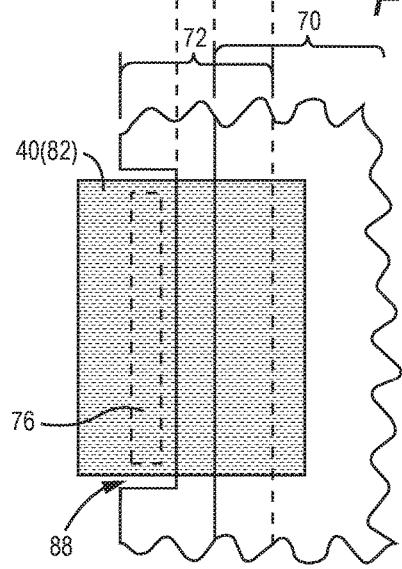

FIGS. 4A-4B provide an alternative WLP BAW device with a surface mount connection structure.

Figure 5A:
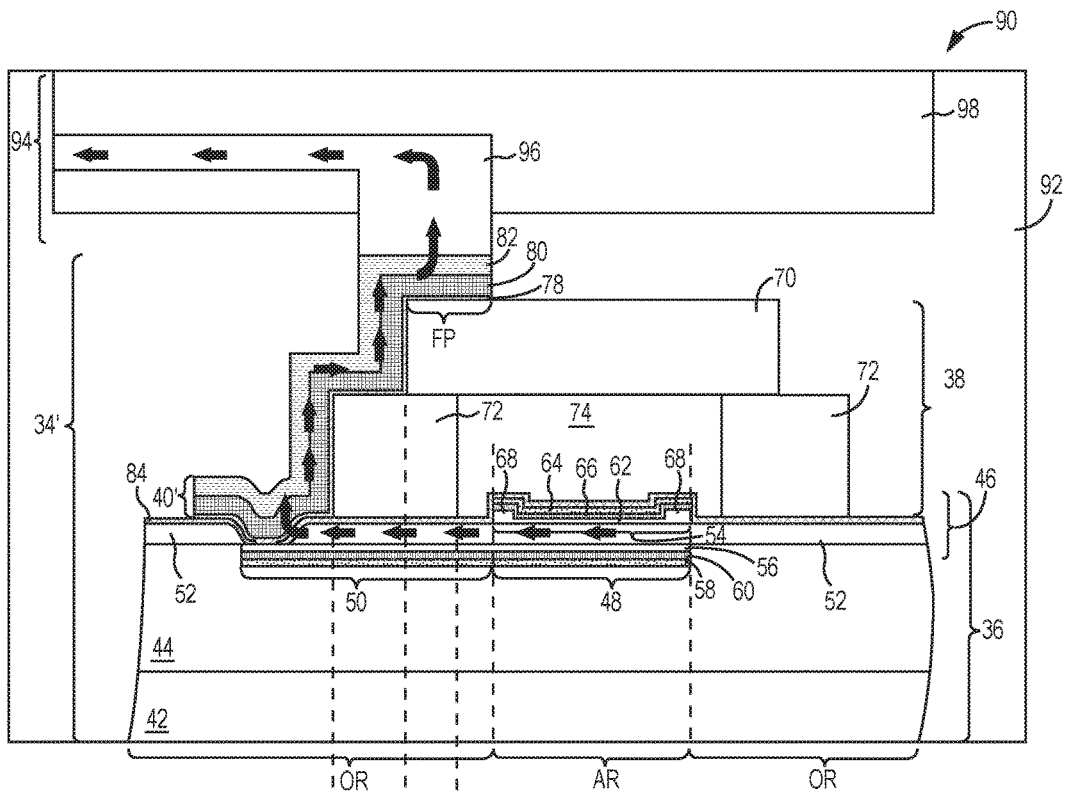
Figure 5B:
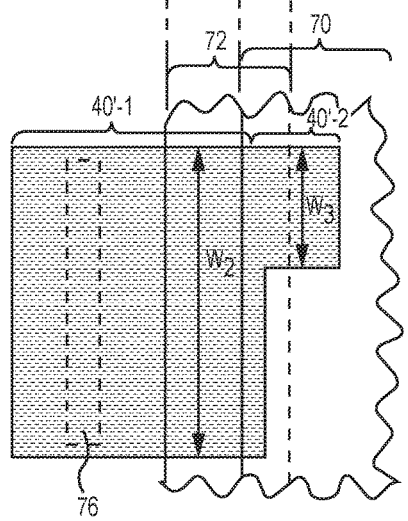

FIGS. 5A-5B provide an exemplary system assembly including a WLP BAW device with a surface mount connection structure.

Figure 6A:
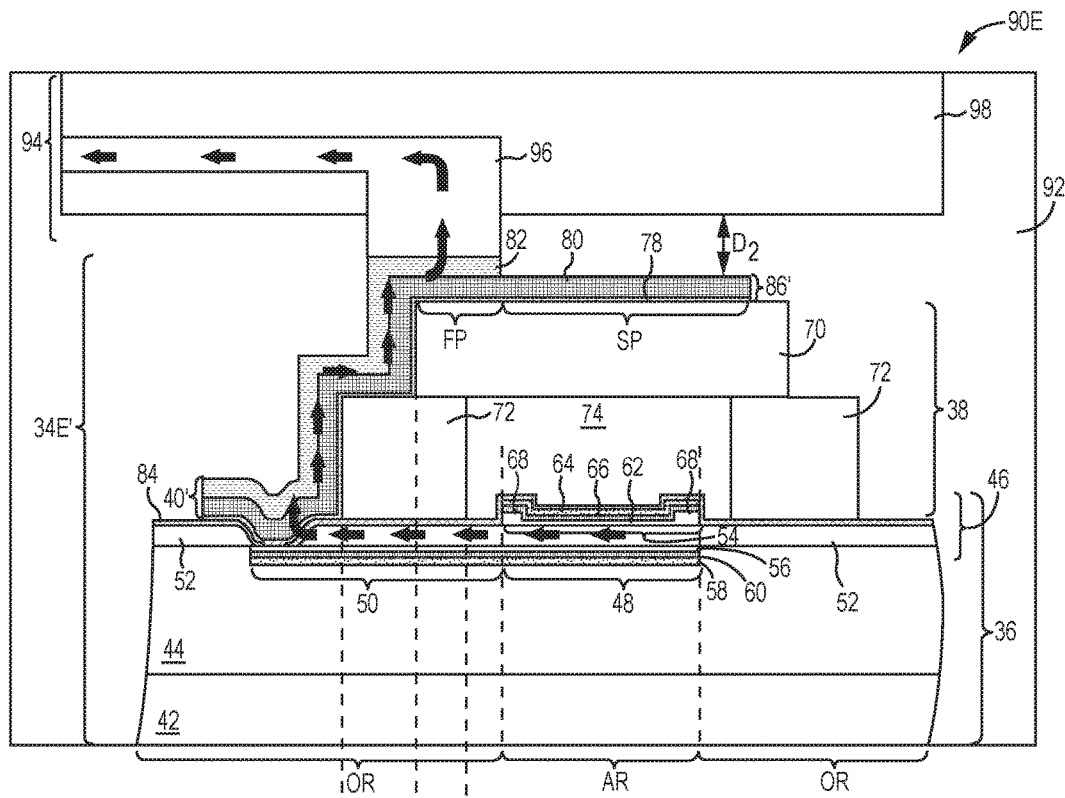
Figure 6B:
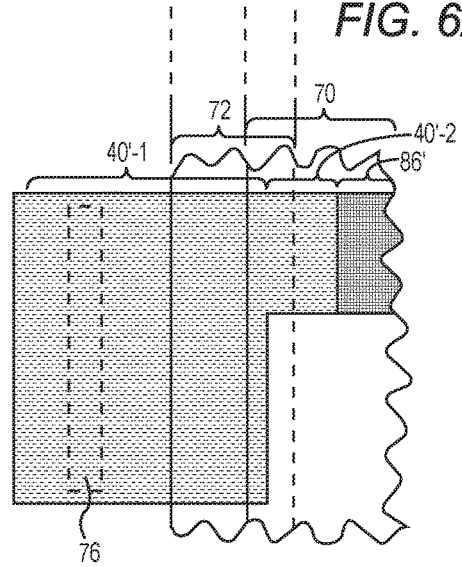

FIGS. 6A-6B provide an exemplary system assembly including a WLP BAW device with a surface mount connection extension.

Figure 7A:
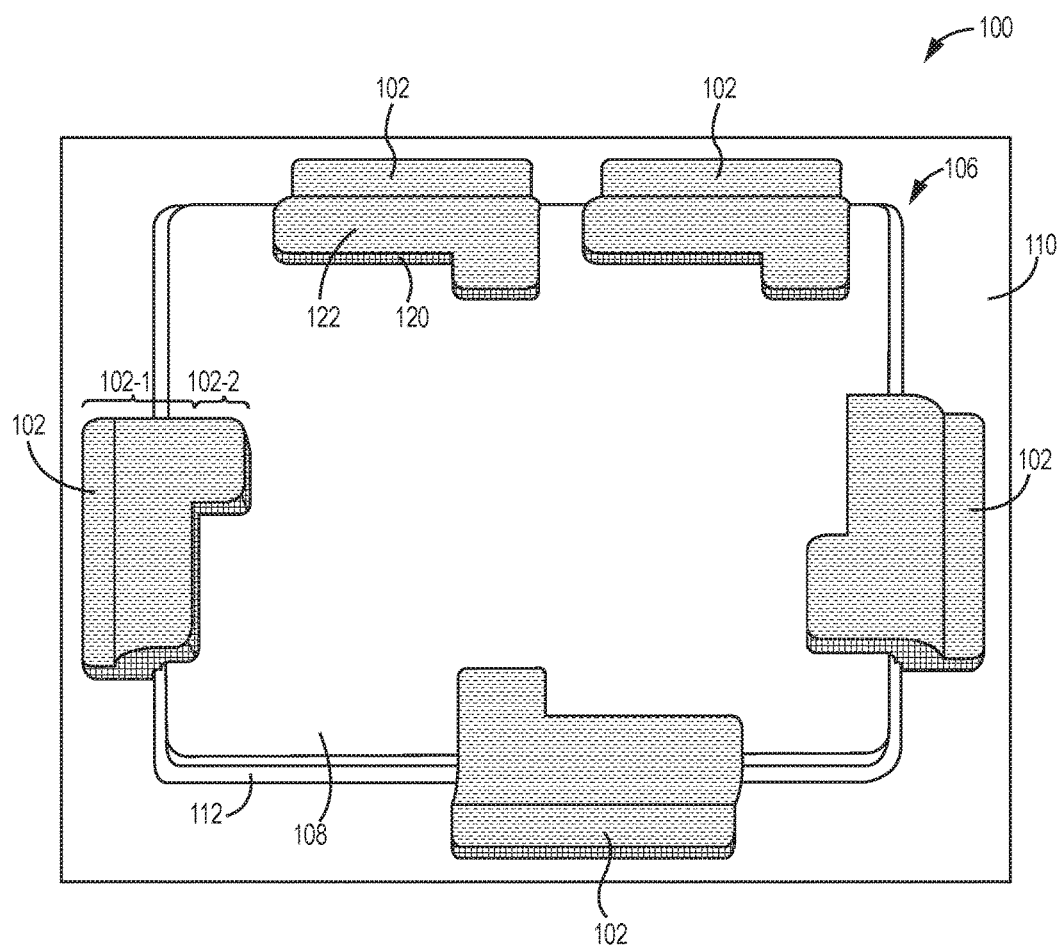
Figure 7B:
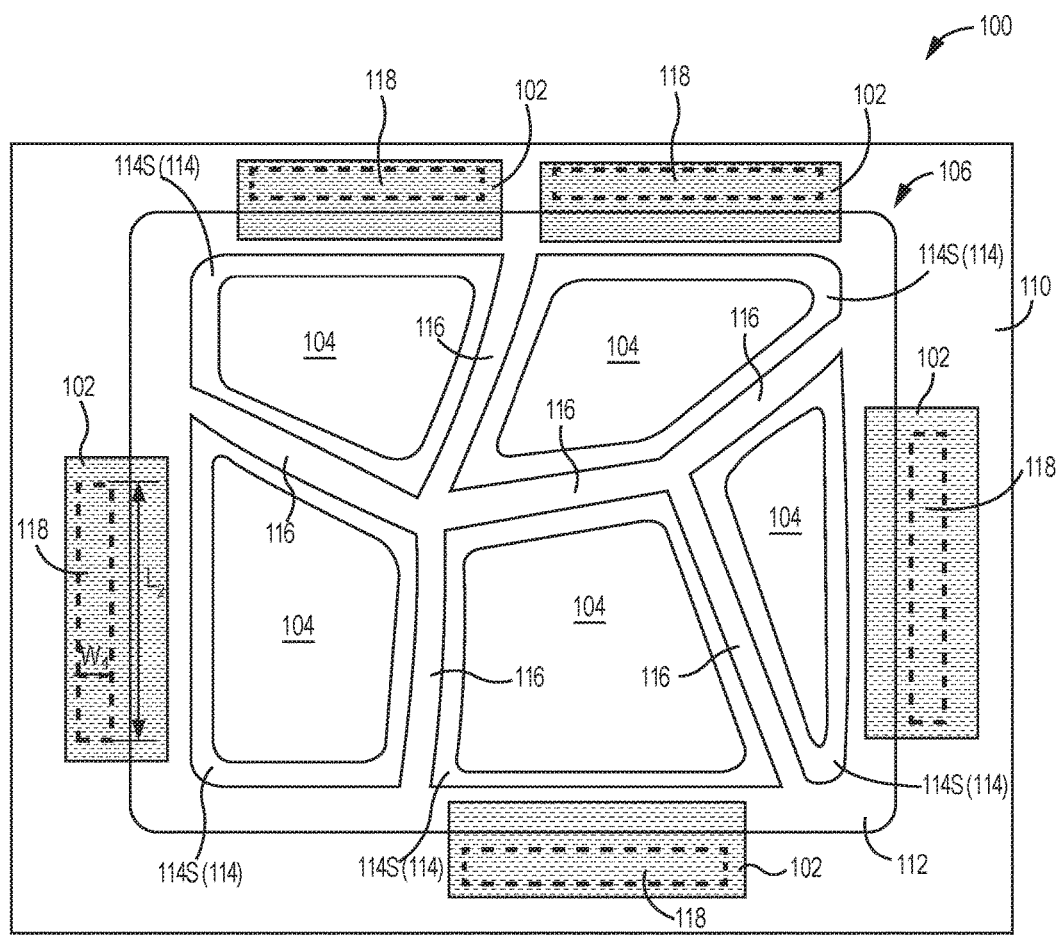

FIGS. 7A-7B provide an exemplary WLP BAW device with multiple surface mount connection structures.

Figure 8A:
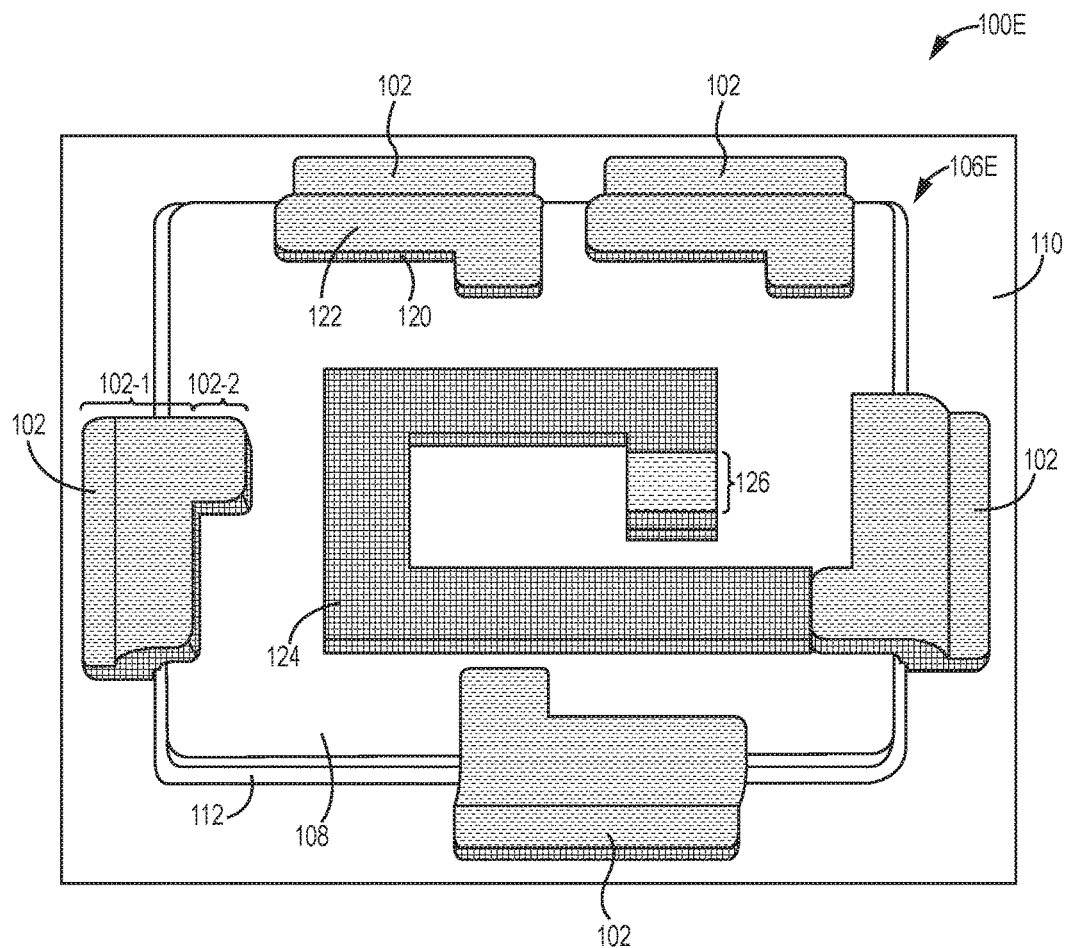
Figure 8B:
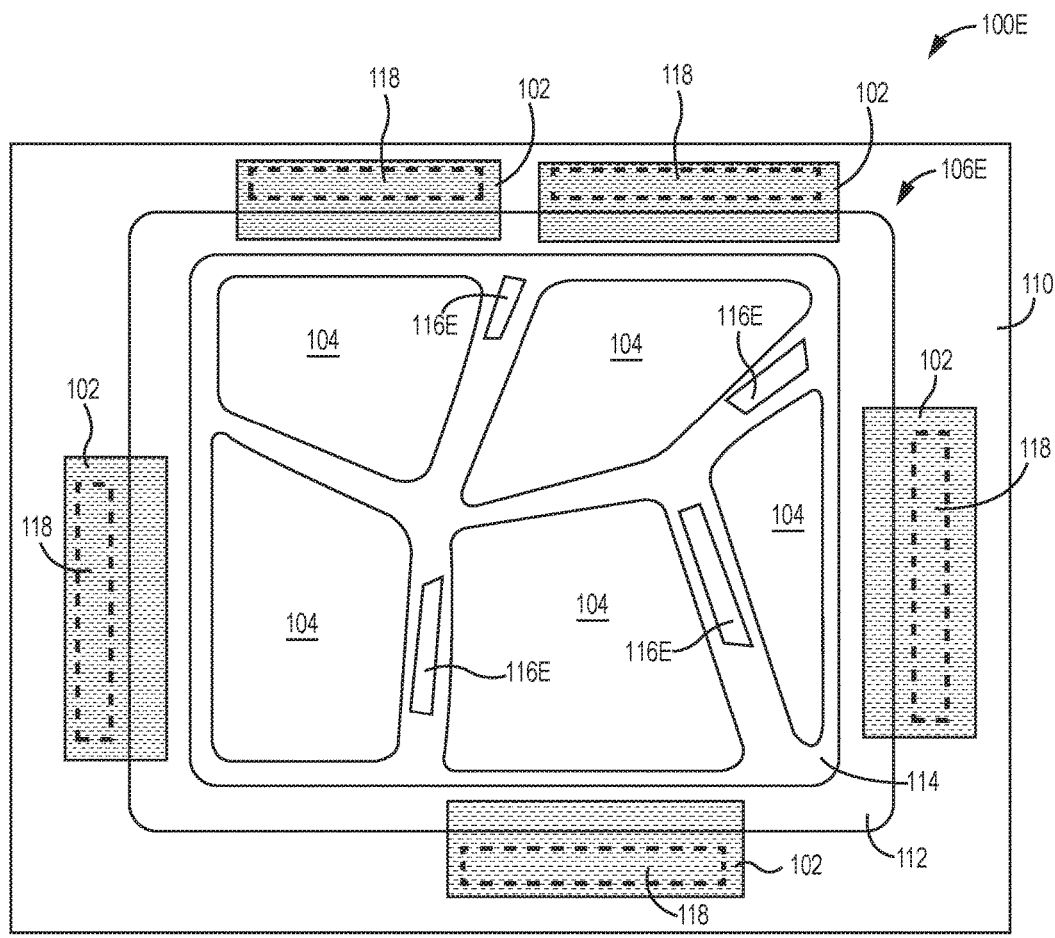

FIGS. 8A-8B provide an exemplary WLP BAW device with multiple surface mount connection structures and a surface mount connection extension.

Figure 9A:
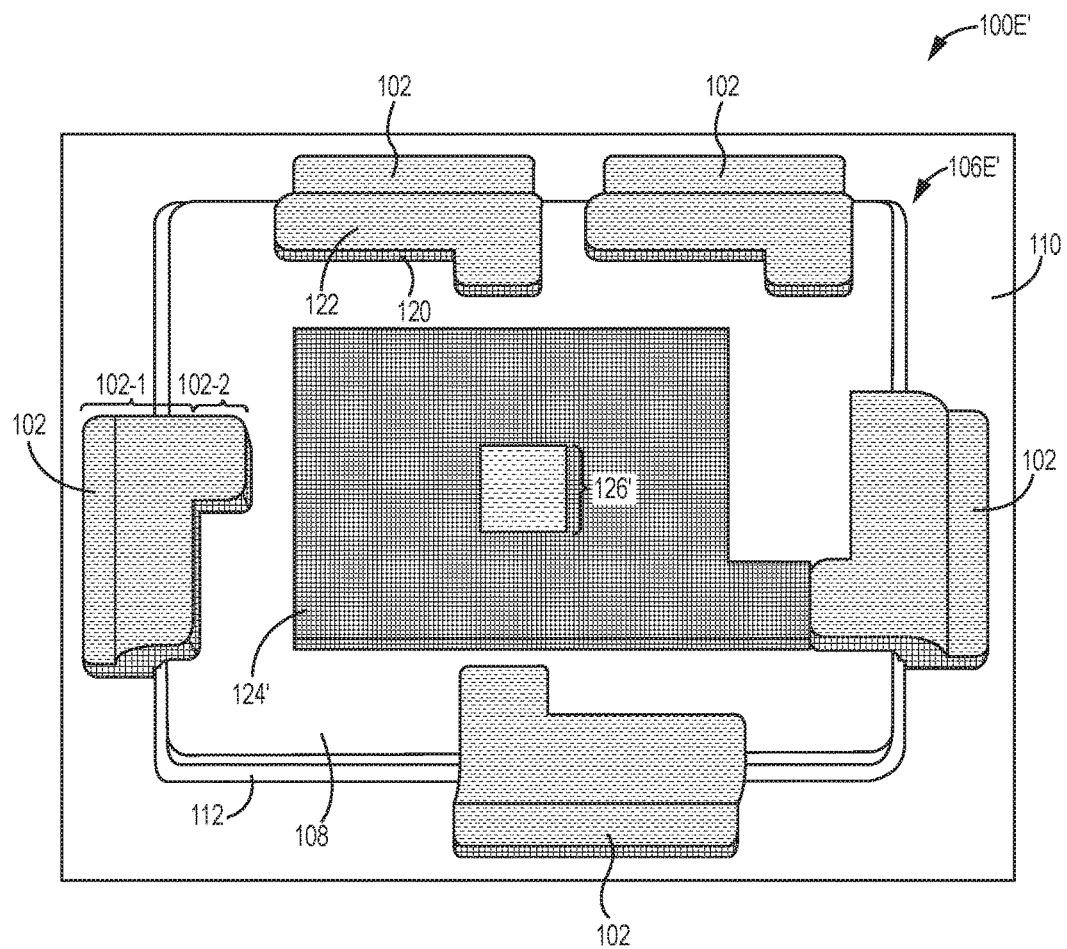
Figure 9B:
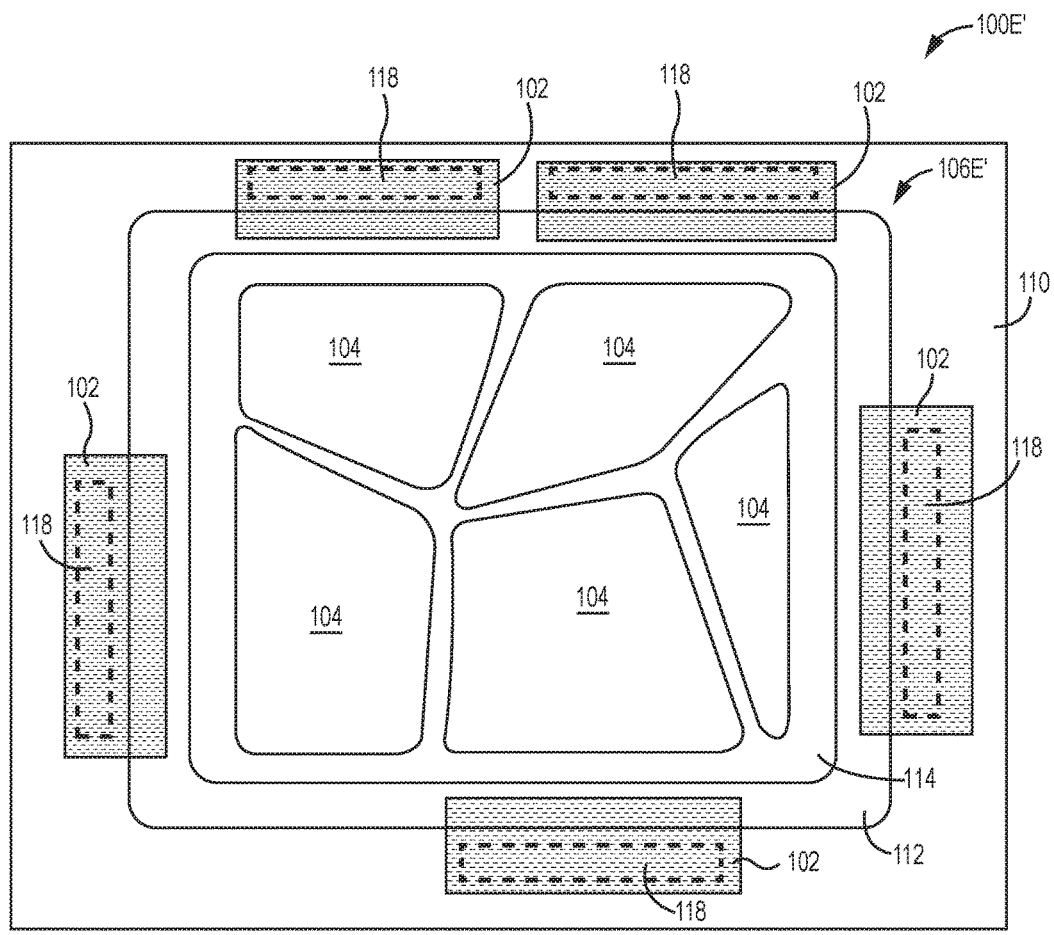

FIGS. 9A-9B provide an exemplary WLP BAW device with multiple surface mount connection structures and an alternative surface mount connection extension.

It will be understood that for clear illustrations, FIGS. 1-9B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 2A-2B provide an exemplary Wafer-Level-Packaged (WLP) Bulk Acoustic Wave (BAW) device 34 without copper pillar connections. FIG. 2A shows a cross-sectional view of the WLP BAW device 34, and FIG. 2B shows a partial top view of the WLP BAW device 34. For the purpose of this illustration, the WLP BAW device 34 includes a BAW resonator 36, a WLP enclosure 38, and a surface mount connection structure 40. In different applications, the WLP BAW device 34 may include multiple BAW resonators and multiple surface mount connection structures.

The BAW resonator 36 includes a substrate 42, a reflector region 44 over the substrate 42, and a transducer region 46 over the reflector region 44. The substrate 42 may be formed of Silicon (Si). The reflector region 44 includes multiple alternating layers (not shown) of alternating materials with varying refractive index. In this embodiment, these multiple alternating layers may be formed of Silicon Dioxide ($SiO_2$) and Tungsten (W). The transducer region 46 includes a bottom electrode 48, a bottom electrode lead 50 connected to the bottom electrode 48, a piezoelectric layer 52, and a top electrode 54 (the top electrode 54 may be connected to an inward top electrode lead not shown here). The bottom electrode 48 and the bottom electrode lead 50 are on the bottom surface of the piezoelectric layer 52. The top electrode 54 is on the top surface of the piezoelectric layer 52. Herein, the top surface of the piezoelectric layer 52 is opposite the bottom surface of the piezoelectric layer 52.

An active region AR for the BAW resonator 36 is formed where the bottom electrode 48 and the top electrode 54 overlap, and also includes the layers below the overlapping top and bottom electrodes 48 and 54. Other sections of the BAW resonator 36 that surround the active region AR are outside regions OR. The bottom electrode lead 50 resides within the outside regions OR. In operation, acoustic waves in the piezoelectric layer 52 within the active region AR of the BAW resonator 36 are excited by an electrical signal applied to the bottom and top electrodes 48 and 54. The frequency at which resonance of the acoustic waves occurs is a function of the thickness of the reflector region 44, the piezoelectric layer 52, and the mass of the bottom and top electrodes 48 and 54. At high frequencies (e.g., greater than 1.5 GHz), the thickness of the piezoelectric layer 52 may be only micrometers thick and, as such, the BAW resonator 36 may be fabricated using thin-film techniques.

The bottom electrode 48 and the bottom electrode lead 50 are formed from a first bottom electrode layer 56 and a second bottom electrode layer 58. Herein, the first bottom electrode layer 56 is over the bottom surface of the piezoelectric layer 52 and the second bottom electrode layer 58 is over the first bottom electrode layer 56. In order to improve the interface region between the first bottom electrode layer 56 and the second bottom electrode layer 58, a bottom seed layer 60 may be formed in between.

Similarly, the top electrode 54 is formed from a first top electrode layer 62 and a second top electrode layer 64. Herein, the first top electrode layer 62 is over the top surface of the piezoelectric layer 52 and the second top electrode layer 64 is over the first top electrode layer 62. In order to improve the interface region between the first top electrode layer 62 and the second top electrode layer 64, a top seed layer 66 may be formed in between. In addition, the top electrode 54 may further include a border ring 68 that is between the first top electrode layer 62 and the second top electrode layer 64, and around a periphery of the active region AR of the BAW resonator 36.

In this embodiment, the first bottom electrode layer 56 and the first top electrode layer 62 may be formed of W, Molybdenum (Mo), or other electrically conductive materials with high acoustic impedance property. The border ring 68 may be formed of W, Mo, or other electrically conductive materials with high acoustic impedance property. The bottom seed layer 60 and the top seed layer 66 may be formed of Titanium (Ti) or Titanium Tungsten (TiW). And the second bottom electrode layer 58 and the second top electrode layer 64 may be formed of Aluminum Copper (AlCu) or other highly electrically conductive materials.

The WLP enclosure 38 includes a cap 70 and an outer wall 72 that extends from the cap 70 toward the top surface of the piezoelectric layer 52 to form an enclosed cavity 74. The top electrode 54 of the BAW resonator 36 resides in the cavity 74. In different applications, the cap 70 may cover a portion of a top surface of the outer wall 72, may fully cover the top surface of the outer wall 72 (not shown), or may even extend laterally beyond the outer wall 72 (not shown). The WLP enclosure 38 may be formed of TMMF, SU-8, or photo-definable epoxies. The cap 70 has a thickness T1 between 10 µm and 60 µm, and the outer wall 72 has a height H1 between 10 µm and 60 µm.

In one embodiment, the piezoelectric layer 52 has an opening 76 outside the cavity 74 and adjacent to the outer wall 72. A portion of the bottom electrode lead 50 is exposed through the opening 76 of the piezoelectric layer 52 and connected to the surface mount connection structure 40, which provides an external electrical connection for the WLP BAW device 34. The opening 76 is desired to be narrow to save device size, and long enough to provide a superior heat dissipation path. The opening 76 of the piezoelectric layer 52 may have a width W1 between 2 µm and 20 µm, and a length L1 between 5 µm and 250 µm.

The surface mount connection structure 40 includes a connection seed layer 78, a first connection layer 80 over the connection seed layer 78, and a second connection layer 82 over the first connection layer 80. The surface mount connection structure 40 covers a first portion FP of a top surface of the cap 70 and extends continuously over a side portion of the WLP enclosure 38 and to the exposed portion of the bottom electrode lead 50 through the opening 76 of the piezoelectric layer 52. Herein, the surface mount connection structure 40 may fully cover the opening 76 of the piezoelectric layer 52. In some applications, the surface mount connection structure 40 may not include the connection seed layer 78, such that the first connection layer 80 may be directly connected to the exposed portion of the bottom electrode lead 50 through the opening 76 of the piezoelectric layer 52. The connection seed layer 78 may be formed of Ti or TiW. The first connection layer 80 may be formed of Copper (Cu) or Gold (Au) with a thickness T2 between 3 µm and 60 µm or between 3 µm and 30 µm. The second connection layer 82 may be formed of Tin (Sn) or Tin-lead (Sn—Pb) with a thickness T3 between 10 µm and 40 µm.

Unlike the conventional WLP BAW device 10 illustrated in FIG. 1, the WLP BAW device 34 does not have space requirement between the outer wall 72 of the WLP enclosure 38 and the opening 76 of the piezoelectric layer 52. A distance D1 between the outer wall 72 of the WLP enclosure 38 and the opening 76 of the piezoelectric layer 52 may be less than 10 µm. Consequently, the size of the WLP BAW device 34 may be reduced compared to the conventional WLP BAW device 10. In addition, since the surface mount connection structure 40 conforms to the cap 70 and outer wall 72, the surface mount connection structure 40 helps to anchor down the WLP enclosure 38 and reduce delamination issues of the WLP enclosure 38.

Lastly, the WLP BAW device 34 may include a passivation layer 84 over both the active region AR and the outside regions OR of the BAW resonator 36. However, the passivation layer 84 does not cover the bottom of the opening 76 of the piezoelectric layer 52, such that the portion of the bottom electrode lead 50 is exposed through the passivation layer 84 at the bottom of the opening 76. Herein, the passivation layer 84 is directly over exposed surfaces of the first top electrode 54 and an exposed portion of the top surface of the piezoelectric layer 52 through the first top electrode 54. As such, the outer wall 72 is coupled to the piezoelectric layer 52 via the passivation layer 84. The passivation layer 84 may be formed of Silicon Nitride (SiN), SiO$_2$, or Silicon Oxynitride (SiON), with a thickness between 250 Å and 5000 Å.

In order to improve cap strength, besides the BAW resonator 36, the WLP enclosure 38, and the surface mount connection structure 40, a WLP BAW device 34E further includes a surface mount connection extension 86, as illustrated in FIGS. 3A and 3B. The surface mount connection extension 86 is connected to the surface mount connection structure 40 and extends over a second portion SP of the top surface of the cap 70. Herein, the second portion SP of the top surface of the cap 70 may cover between 10% and 95% of the cavity 74. The surface mount connection structure 40 and the surface mount connection extension 86 may be formed from the common connection seed layer 78, the common first connection layer 80, and the common second connection layer 82.

Herein, the surface mount connection extension 86, especially the first connection layer 80 is stiffer than the WLP enclosure 38. The surface mount connection extension 86 extending over the second portion SP of the top surface of the cap 70 may improve the strength of the cap 70 to obviate collapses. For instance, the cap 70 of the WLP enclosure 38 (formed of TMMF) needs a thickness about 45 µm to withstand 5 MPa overmold pressures, while the first connection layer 80 (formed of Cu) only needs 7 µm to withstand 5 MPa overmold pressures. Consequently, with the first connection layer 80 extending over the second portion SP of the top surface of the cap 70, the thickness of the cap 70 may reduce. Generally, a thicker first connection layer may allow a thinner cap, and a greater coverage of the first connection layer may also allow a thinner cap. For instance, if the first connection layer 80 is formed of copper with a thickness between 3 µm and 30 µm and covering at least 5% or at least 25% of the cavity 74, the thickness of the cap 70 may be reduced to between 40 µm and 10 µm accordingly. Further, the thickness of the cap 70 may also be affected by the second connection layer 82, the placement of the first and second connection layers 80 and 82, and the size and shape of the cavity 74.

FIGS. 4A-4B provide an alternative WLP BAW device 34R having the BAW resonator 36, the surface mount connection structure 40, and an alternative WLP enclosure 38R. The WLP enclosure 38R includes the cap 70 and an alternative outer wall 72R with a recess 88. The recess 88 is at an outer side surface of the outer wall 72R. In this embodiment, the opening 76 of the piezoelectric layer 52 is confined within the recess 88. Consequently, the surface mount connection structure 40 covers the first portion FP of the top surface of the cap 70, and extends continuously over a side portion of the WLP enclosure 38R through the recess 88 and to the exposed portion of the bottom electrode lead 50 through the opening 76 of the piezoelectric layer 52. It is clear to those skilled in the art that the device size of the WLP BAW device 34R is further reduced because the opening 76 of the piezoelectric layer 52, where the surface mount connection structure 40 is connected to the bottom electrode lead 50, is confined within the recess 88 of the outer wall 72R. Notice that, in the WLP BAW device 34R, the opening 76 of the piezoelectric layer 52 is deliberately not encapsulated by the WLP enclosure 38R to obviate Coefficient of Thermal Expansion (CTE) mismatch between the WLP enclosure 38R and the surface mount connection structure 40.

FIGS. 5A-5B provide an exemplary system assembly 90 including a WLP BAW device 34', a mold compound material 92, and a printed circuit board (PCB) 94. The WLP BAW device 34' includes the BAW resonator 36, the WLP enclosure 38, and a surface mount connection structure 40'. The mold compound material 92 encapsulates the WLP BAW device 34' and the PCB 94, and fills gaps in between. The mold compound material 92 may be formed of bi-phenyl epoxy with inorganic filler or bi-phenyl epoxy with high thermal conductivity filler. The PCB 94 includes a PCB lead 96 and a PCB laminate body 98 parallel with the cap 70 of the WLP BAW device 34'. The PCB lead 96 is embedded in the PCB laminate body 98, extends over a portion of a first surface of the PCB laminate body 98, which is facing the cap 70, and is coupled to the surface mount connection structure 40' of the WLP BAW device 34'.

The surface mount connection structure 40' is formed from the connection seed layer 78, the first connection layer 80 over the connection seed layer 78, and the second connection layer 82 over the first connection layer 80. The surface mount connection structure 40' covers the first portion FP of the top surface of the cap 70 and extends continuously over the side portion of the WLP enclosure 38 and to the exposed portion of the bottom electrode lead 50 through the opening 76 of the piezoelectric layer 52. In some applications, the surface mount connection structure 40' may not include the connection seed layer 78, such that the first connection layer 80 may be directly connected to the exposed portion of the bottom electrode lead 50 through the opening 76 of the piezoelectric layer 52.

Herein, the surface mount connection structure 40' may be divided into two portions: a surface mount lead 40'-1 and a surface mount pad 40'-2. The surface mount pad 40'-2 is over the top surface of the cap 70 and in contact with the PCB lead 96. The surface mount lead 40'-1 is connected to the exposed portion of the bottom electrode lead 50, and extends continuously from the opening 76 of the piezoelectric layer 52, over the side portion of the WLP enclosure 38, and to the surface mount pad 40'-2. Heat generated by the BAW resonator 36 may dissipate through the surface mount connection structure 40' and towards the PCB 94 via the PCB lead 96. In order to improve heat dissipation from the BAW resonator 36 to the PCB 94, a wide width of the surface mount lead 40'-1 is desired. A width W2 of the surface mount lead 40'-1 is between 10 μm and 250 μm. In addition, in order to reduce parasitic capacitance between the surface mount pad 40'-2 and adjacent surface mount pads/surface mount connection extension (not shown), a narrow width of the surface mount pad 40'-2 is desired. A width W3 of the surface mount pad 40'-2 is between 10 μm and 50 μm. The width W3 of the surface mount pad 40'-2 is no wider than the first width W2 of the surface mount lead 40'-1.

FIGS. 6A-6B provide another system assembly 90E, which includes a WLP BAW device 34E' with a surface mount connection extension 86', the mold compound material 92, and the PCB 94. Besides the surface mount connection extension 86', the WLP BAW device 34E' also includes the BAW resonator 36, the WLP enclosure 38, and the surface mount connection structure 40'. The surface mount connection extension 86' is connected to the surface mount connection structure 40' and extends over the second portion SP of the top surface of the cap 70 to improve the cap strength.

In this embodiment, the surface mount connection structure 40' and the surface mount connection extension 86' may be formed from the common connection seed layer 78 and the common first connection layer 80. However, the surface mount connection extension 86' may or may not include the second connection layer 82. Without the second connection layer 82, a distance D2 between the surface mount connection extension 86' and the PCB laminate body 98 increases. As such, the parasitic capacitances between the surface mount connection extension 86' and adjacent metal elements on the first surface of the PCB laminate body 98 (not shown) may be reduced, and the penetration of the mold compound material 92 may improve. Herein, the first connection layer 80 and the second connection layer 82 may be formed in a two-step plating process, which allows the first connection layer 80 to be patterned and plated separately from the second connection layer 82. In addition, because the first connection layer 80 (used to form the surface mount connection structure 40' and the surface mount connection extension 86') is stiffer than the WLP enclosure 38, the first connection layer 80 covering at least a portion of the cavity 74 may obviate collapses of the cap 70.

In some applications, a WLP BAW device 100 may include multiple surface mount connection structures 102 and multiple BAW resonators 104, as illustrated in FIGS. 7A and 7B. FIG. 7A shows a 3D view of the WLP BAW device 100 with a WLP enclosure 106, and FIG. 7B shows a top view of the WLP BAW device 100 under a cap 108 of the WLP enclosure 106. For the purpose of this illustration, the WLP BAW device 100 includes five surface mount connection structures 102, five BAW resonators 104 with a common piezoelectric layer 110, and the WLP enclosure 106. In different applications, the WLP BAW device 100 may include fewer or more surface mount connection structures 102 and fewer or more BAW resonators 104.

The WLP enclosure 106 includes the cap 108 and an outer wall 112. The outer wall 112 extends from the cap 108 toward a top surface of the piezoelectric layer 110 to form a large cavity 114. In this embodiment, the WLP enclosure 106 may further include at least one continuous inner wall 116, which extends from the cap 108 toward the top surface of the piezoelectric layer 110 and is connected to the outer wall 112. Herein, the continuous inner wall 116 divides the cavity 114 into five separate sub-cavities 114S. Each BAW resonator 104 is encapsulated by the WLP enclosure 106 and resides in a corresponding sub-cavity 114S. The WLP enclosure 106 may be formed of TMMF, SU-8, or photo-definable epoxies. There may be a passivation layer (not shown) between the top surface of the piezoelectric layer 110 and the WLP enclosure 106.

Herein, the piezoelectric layer 110 has five openings 118 corresponding to the five BAW resonators 104. None of the openings 118 is inside the cavity 114. Each opening 118 is adjacent to the outer wall 112. A portion of a bottom electrode lead (not shown for clarity) of each BAW resonator 104 is exposed through a corresponding opening 118, and connected to a corresponding surface mount connection structure 102. Each opening 118 is desired to be narrow to save device size, and long to provide a superior heat dissipation path. Each opening 118 of the piezoelectric layer 110 may have a width W4 between 2 µm and 20 µm, and a length L2 between 5 µm and 250 µm.

Each surface mount connection structure 102 may be divided into two portions: a surface mount lead 102-1 and a surface mount pad 102-2 (only one surface mount lead and one surface mount pad are labeled with reference numbers for clarity). The surface mount pad 102-2 is over the cap 108 of the WLP enclosure 106 and is in contact with a PCB (not shown). The surface mount lead 102-1 is connected to an exposed portion of a bottom electrode lead of one BAW resonator 104, and extends continuously from one opening 118 of the piezoelectric layer 108, along a side portion of the WLP enclosure 106, and to the surface mount pad 102-2. The surface mount pad 102-2 may have a narrower width than the surface mount lead 102-1. In addition, each surface mount connection structure 102 may be formed from a first connection layer 120 and a second connection layer 122 over the first connection layer 120. There may be a connection seed layer (not shown) underneath the first connection layer 120. The first connection layer 120 may be formed of Cu or Au with a thickness between 3 µm and 60 µm. The second connection layer 122 may be formed of Sn or Sn—Pb with a thickness between 10 µm and 40 µm.

FIGS. 8A and 8B provide another WLP BAW device 100E including the surface mount connection structures 102, the BAW resonators 104, a WLP enclosure 106E, and a surface mount connection extension 124 with an extension pad 126. In different applications, the WLP BAW device 100E may include multiple surface mount connection extensions.

The surface mount connection extension 124 is connected to one of the surface mount connection structures 102 and extends over a portion of the top surface of the cap 108. The extension pad 126 may be located at any portion of the surface mount connection extension 124 and used to connect with a PCB (not shown). Herein, the surface mount connection extension 124 has a ring-like shape and may provide an integrated inductor. Other shapes (like a rectangular shape, an "L" shape, a "T" shape, a cross shape, or a saw-tooth shape) may also apply depending on different applications. The surface mount connection extension 124 and the surface mount connection structures 102 may be formed from the common first connection layer 120. However, except for the extension pad 126, the remaining portions of the surface mount connection extension 124 may not include the second connection layer 122. In addition, since the surface mount pad 102-2 may have a relatively narrow width, possible parasitic capacitance between the surface mount pad 102-2 and an adjacent portion of the surface mount connection extension 124 may be reduced.

Because the surface mount connection extension 124 (the first connection layer 120) is stiffer than the WLP enclosure 106E, which may be formed of TMMF, SU-8, or photo-definable epoxies, the surface mount connection extension 124 extending over the portion of the top surface of the cap 108 may improve the strength of the cap 108. As such, the WLP enclosure 106E may include stand-alone inner walls 116E instead of the continuous inner wall 116 to support the cap 108. These stand-alone inner walls 116E are not connected to the outer wall 112 and do not completely separate the BAW resonators 104, such that the BAW resonators 104 are allowed to be placed closer together, which may reduce the device size of the WLP BAW device 100E. There may be a passivation layer (not shown) between the top surface of the piezoelectric layer 110 and the WLP enclosure 106E.

FIGS. 9A and 9B provide a WLP BAW device 100E' with an alternative surface mount connection extension 124' including a connection pad 126'. Besides the surface mount connection extension 124', the WLP BAW device 100E' also includes the surface mount connection structures 102, the BAW resonators 104, and a WLP enclosure 106E'. The surface mount connection extension 124' is connected to one of the surface mount connection structures 102 and extends over a portion of the top surface of the cap 108. The extension pad 126' may be located at any portion of the surface mount connection extension 124' and used to connect with a PCB (not shown). Herein, the surface mount connection extension 124' is a slab. The surface mount connection extension 124' and the surface mount connection structures 102 may be formed from the common first connection layer 120. However, except for the extension pad 126', the remaining portions of the surface mount connection extension 124' may not include the second connection layer 122.

In this embodiment, the WLP enclosure 106E' includes the cap 108 and the outer wall 112, but may not include any inner walls. The reason of no inner walls is that a combination of the cap 108 and the surface mount connection extension 124' may withstand high overmold pressures (like 5 MPa) without inner wall supports. Herein, the surface mount connection extension 124' covers between 10% and 95% of the cavity 114. Without the inner walls, the BAW resonators 104 are allowed to have a compact arrangement to further reduce the device size of the WLP BAW device 100E'.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
a piezoelectric layer with an opening;
a bottom electrode over a bottom surface of the piezoelectric layer;
a bottom electrode lead over the bottom surface of the piezoelectric layer and extending from the bottom electrode, wherein a portion of the bottom electrode lead is exposed through the opening of the piezoelectric layer;
a top electrode over a top surface of the piezoelectric layer, wherein:
the top surface of the piezoelectric layer is opposite the bottom surface of the piezoelectric layer; and
an active region for a resonator is formed where the bottom electrode and the top electrode overlap;
a Wafer-Level-Packaged (WLP) enclosure comprising a cap and an outer wall that extends from the cap toward the top surface of the piezoelectric layer to form a cavity, wherein the top electrode resides in the cavity and the opening of the piezoelectric layer is outside the cavity; and
a surface mount connection structure that covers a first portion of a top surface of the cap and extends continuously over a side portion of the WLP enclosure and to the exposed portion of the bottom electrode lead through the opening of the piezoelectric layer.

2. The apparatus of claim 1 wherein the opening of the piezoelectric layer is adjacent to the outer wall with a distance less than 10 µm.

3. The apparatus of claim 1 wherein the opening of the piezoelectric layer has a width between 2 µm and 20 µm, and a length between 5 µm and 250 µm.

4. The apparatus of claim 1 wherein the surface mount connection structure comprises:
a first connection layer formed of Copper (Cu) or Gold (Au); and
a second connection layer over the first connection layer and formed of Tin (Sn) or Tin-lead (Sn—Pb).

5. The apparatus of claim 4 wherein the first connection layer has a thickness between 3 µm and 60 µm, and the second connection layer has a thickness between 10 µm and 40 µm.

6. The apparatus of claim 4 wherein the surface mount connection structure further comprises a connection seed layer underneath the first connection layer and formed of Titanium (Ti) or Titanium Tungsten (TiW).

7. The apparatus of claim 1 wherein the cap has a thickness between 10 µm and 60 µm, and the outer wall has a height between 10 µm and 60 µm.

8. The apparatus of claim 1 further comprising a passivation layer, wherein:
the passivation layer is directly over a portion of the top surface of the piezoelectric layer and exposed surfaces of the top electrode, such that the outer wall is directly coupled to the passivation layer; and
the passivation layer does not cover the bottom of the opening of the piezoelectric layer, such that the portion of the bottom electrode lead is exposed through the passivation layer at the bottom of the opening of the piezoelectric layer.

9. The apparatus of claim 1 further comprising a surface mount connection extension, which is connected to the surface mount connection structure and extends over a second portion of the top surface of the cap.

10. The apparatus of claim 9 wherein the second portion of the top surface of the cap covers between 10% and 95% of the cavity.

11. The apparatus of claim 9 wherein:
the surface mount connection structure and the surface mount connection extension are formed from a common first connection layer;
the surface mount connection structure further comprises a second connection layer over the first connection layer; and
the first connection layer is formed of Cu or Au, and the second connection layer is formed of Sn or Sn—Pb.

12. The apparatus of claim 11 wherein the first connection layer has a thickness between 3 µm and 60 µm, and the second connection layer has a thickness between 10 µm and 40 µm.

13. The apparatus of claim 12 wherein the second portion of the top surface of the cap covers between 10% and 95% of the cavity.

14. The apparatus of claim 11 wherein the surface mount connection extension further includes the second connection layer.

15. The apparatus of claim 11 wherein the surface mount connection extension does not include the second connection layer.

16. The apparatus of claim 1 wherein the outer wall includes a recess at an outer side surface of the outer wall, wherein the opening of the piezoelectric layer is confined within the recess, such that the surface mount connection structure covers the first portion of the top surface of the cap, and extends continuously over the side portion of the WLP enclosure through the recess and to the exposed portion of the bottom electrode lead through the opening of the piezoelectric layer.

17. An apparatus comprising:
a WLP Bulk Acoustic Wave (BAW) device comprising:
a piezoelectric layer with an opening;
a bottom electrode over a bottom surface of the piezoelectric layer;
a bottom electrode lead over the bottom surface of the piezoelectric layer and extending from the bottom electrode, wherein a portion of the bottom electrode lead is exposed through the opening of the piezoelectric layer;
a top electrode on a top surface of the piezoelectric layer, wherein:
the top surface of the piezoelectric layer is opposite the bottom surface of the piezoelectric layer; and
an active region for a resonator is formed where the bottom electrode and the top electrode overlap;
a WLP enclosure comprising a cap and an outer wall that extends from the cap toward the top surface of the piezoelectric layer to form a cavity, wherein the top electrode resides in the cavity and the opening of the piezoelectric layer is outside the cavity; and
a surface mount connection structure that covers a first portion of a top surface of the cap and extends continuously over a side portion of the WLP enclosure and to the exposed portion of the bottom electrode lead through the opening of the piezoelectric layer; and
a printed circuit board (PCB) including a PCB lead and a PCB laminate body parallel with the cap, wherein the PCB lead is embedded in the PCB laminate body, extends over a portion of a first surface of the PCB laminate body, and is coupled to the surface mount connection structure.

18. The apparatus of claim 17 further comprising a mold compound material that encapsulates the WLP BAW device and the PCB, and fills gaps in between.

19. The apparatus of claim 17 wherein the surface mount connection structure comprises a surface mount lead and a surface mount pad, wherein:
the surface mount pad is over the top surface of the cap and in contact with the PCB lead; and
the surface mount lead is connected to the exposed portion of the bottom electrode lead, and extends continuously from the opening of the piezoelectric layer, over the side portion of the WLP enclosure, and to the surface mount pad.

20. The apparatus of claim 18 wherein the surface mount pad has a width between 10 µm and 50 µm, and the surface mount lead has a width between 10 µm and 250 µm.

21. The apparatus of claim 18 wherein a width of the surface mount pad is no wider than a width of the surface mount lead.

22. The apparatus of claim 17 further comprising a surface mount connection extension, which is connected to the surface mount connection structure and extends over a second portion of the top surface of the cap.

23. The apparatus of claim 22 wherein the second portion of the top surface of the cap covers between 10% and 95% of the cavity.

24. The apparatus of claim 22 wherein:
the surface mount connection structure and the surface mount connection extension are formed from a common first connection layer;
the surface mount connection structure further comprises a second connection layer over the first connection layer; and
the first connection layer is formed of Cu or Au and the second connection layer is formed of Sn or Sn—Pb.

25. The apparatus of claim 24 wherein the first connection layer has a thickness between 3 µm and 60 µm, and the second connection layer has a thickness between 10 µm and 40 µm.

26. The apparatus of claim 25 wherein the second portion of the top surface of the cap covers between 10% and 95% of the cavity.

27. The apparatus of claim 24 wherein the surface mount connection extension further incudes the second connection layer.

28. The apparatus of claim 24 wherein the surface mount connection extension does not include the second connection layer.

29. An apparatus comprising:
a first BAW resonator and a second BAW resonator, wherein:
the first BAW resonator and the second BAW resonator share a common piezoelectric layer, which includes a first opening and a second opening;
the first BAW resonator includes a first bottom electrode lead underneath the piezoelectric layer, wherein a portion of the first bottom electrode lead is exposed through the first opening of the piezoelectric layer; and
the second BAW resonator includes a second bottom electrode lead underneath the piezoelectric layer, wherein a portion of the second bottom electrode lead is exposed through the second opening of the piezoelectric layer;
a WLP enclosure comprising a cap and an outer wall that extends from the cap toward a top surface of the piezoelectric layer to form a cavity, wherein
the first BAW resonator and the second BAW resonator reside in the cavity; and
the first opening and the second opening of the piezoelectric layer are outside the cavity; and
a first surface mount connection structure that is connected to the exposed portion of the first bottom electrode lead, and extends continuously from the first opening of the piezoelectric layer, along a first side portion of the WLP enclosure, and to a top surface of the cap; and
a second surface mount connection structure that is connected to the exposed portion of the second bottom electrode lead, and extends continuously from the second opening of the piezoelectric layer, along a second side portion of the WLP enclosure, and to the top surface of the cap.

30. The apparatus of claim 29 wherein the WLP enclosure further comprises a continuous inner wall, which extends from the cap toward the top surface of the piezoelectric layer and is connected to the outer wall, wherein the continuous inner wall divides the cavity into a first sub-cavity and a second sub-cavity, such that the first BAW resonator resides in the first sub-cavity and the second BAW resonator resides in the second sub-cavity.

31. The apparatus of claim 29 wherein the WLP enclosure further comprises a stand-alone inner wall, which extends from the cap toward the top surface of the piezoelectric layer and is not connected to the outer wall.

32. The apparatus of claim 29 further comprising a surface mount connection extension, which is connected to the first surface mount connection structure and extends over a portion of the top surface of the cap.

33. The apparatus of claim 32 wherein the surface mount connection extension provides an integrated inductor.

34. The apparatus of claim 32 wherein the surface mount connection extension is a slab.

35. The apparatus of claim 32 wherein the portion of the top surface of the cap covers between 10% and 95% of the cavity.

* * * * *